(12) United States Patent
Fishman et al.

(10) Patent No.: US 9,118,215 B2
(45) Date of Patent: Aug. 25, 2015

(54) HIGH VOLTAGE ENERGY HARVESTING AND CONVERSION RENEWABLE ENERGY UTILITY SIZE ELECTRIC POWER SYSTEMS AND VISUAL MONITORING AND CONTROL SYSTEMS FOR SAID SYSTEMS

(75) Inventors: Oleg S. Fishman, Maple Glen, PA (US); Ulrich K. W. Schwabe, Norristown, PA (US)

(73) Assignee: ALENCON ACQUISTION CO., LLC, Hatboro, PA (US)

( * ) Notice: Subject to any disclaimer, the term of this patent is extended or adjusted under 35 U.S.C. 154(b) by 878 days.

(21) Appl. No.: 13/253,629

(22) Filed: Oct. 5, 2011

(65) Prior Publication Data

US 2012/0080955 A1 Apr. 5, 2012

Related U.S. Application Data

(60) Provisional application No. 61/485,384, filed on May 12, 2011, provisional application No. 61/389,816, filed on Oct. 5, 2010.

(51) Int. Cl.
*H02J 1/00* (2006.01)
*H02J 3/46* (2006.01)
*H01L 31/02* (2006.01)
*H02J 3/38* (2006.01)

(52) U.S. Cl.
CPC ............. *H02J 3/46* (2013.01); *H01L 31/02021* (2013.01); *H02J 3/383* (2013.01); *H02J 3/386* (2013.01); *Y02E 10/563* (2013.01); *Y02E 10/763* (2013.01); *Y10T 307/707* (2015.04)

(58) Field of Classification Search
None
See application file for complete search history.

(56) References Cited

U.S. PATENT DOCUMENTS

| 7,672,149 | B2 | 3/2010 | Falk | |
| 7,929,325 | B2 | 4/2011 | de Rooij et al. | |
| 2005/0105224 | A1* | 5/2005 | Nishi | 361/18 |
| 2007/0133241 | A1* | 6/2007 | Mumtaz et al. | 363/131 |
| 2007/0217239 | A1 | 9/2007 | Rottger et al. | |
| 2008/0285317 | A1 | 11/2008 | Rotzoll | |
| 2010/0133911 | A1 | 6/2010 | Williams et al. | |
| 2010/0156188 | A1* | 6/2010 | Fishman | 307/77 |
| 2010/0302819 | A1 | 12/2010 | O'Brien et al. | |
| 2011/0310642 | A1* | 12/2011 | Dai et al. | 363/37 |

FOREIGN PATENT DOCUMENTS

KR 1020080001828 A 1/2008

* cited by examiner

*Primary Examiner* — Jared Fureman
*Assistant Examiner* — Aqeel Bukhari
(74) *Attorney, Agent, or Firm* — Philip O. Post

(57) ABSTRACT

A renewable energy, utility size electric power system is provided with a high voltage, renewable energy harvesting network connected by a direct current link to a centralized grid synchronized multiphase regulated current source inverter system. The harvesting network includes distributed renewable energy power optimizers and transmitters that control delivery of renewable energy to the grid synchronized multiphase regulated current source inverter system. A visual immersion monitoring and control system can be provided for a three-dimensional, visually-oriented, virtual reality display, command and control environment.

17 Claims, 7 Drawing Sheets

HIGH VOLTAGE ENERGY HARVESTING AND CONVERSION RENEWABLE ENERGY UTILITY SIZE ELECTRIC POWER SYSTEMS AND VISUAL MONITORING AND CONTROL SYSTEMS FOR SAID SYSTEMS

CROSS REFERENCE TO RELATED APPLICATIONS

This application claims the benefit of U.S. Provisional Application No. 61/389,816, filed Oct. 5, 2010, and U.S. Provisional Application No. 61/485,384, filed May 12, 2011, each of which is hereby incorporated by reference in its entirety.

FIELD OF THE INVENTION

The present invention relates generally to renewable energy, utility size electric power systems and, in particular, to high voltage energy harvesting and conversion renewable energy collection and conversion systems, and to visual monitoring and control systems for such systems.

BACKGROUND OF THE INVENTION

The term "renewable energy electric power systems" as used herein refers to utility size electric power systems that utilize a large number of interconnected photovoltaic modules to form a solar farm or power plant, or a large number of interconnected wind turbine generators that form a wind farm or power plant.

Utility size (ranging from 5 to 100 megawatt ($MW_e$) output capacity) solar photovoltaic power systems comprise a large number of solar photovoltaic power collectors, such as solar photovoltaic modules, that supply DC electric power to collocated DC to AC inverters that convert the DC power into AC electric power.

A utility size wind power system comprises a large number of electrically interconnected wind turbine generators. A wind turbine driven generator assembly can be a wind turbine with its output shaft suitably coupled to an electric generator. Various types of generator systems can be coupled to a wind turbine. One such system is known as a Type 4 industry designated wind turbine generator power system where the generator is a synchronous permanent magnet generator having a variable frequency, variable voltage output that is supplied to a rectifier with the rectified output DC link supplied to a DC to AC inverter. The inverter output current is then transformed through a line transformer that transforms the inverter output voltage level to the grid voltage level.

For either a solar or wind renewable energy, utility size power system, the power system components are spread out over significantly more land than a conventional residential or commercial size power plant thus making physical visualization and control of the power system a challenge beyond that of the typical one line centralized control boards used for conventional size power plants.

It is one object of the present invention to provide monitoring and control systems for a high voltage, renewable energy harvesting network in combination with a centralized grid synchronized multiphase regulated current source inverter system wherein the renewable energy harvesting is distributively power optimized within the harvesting network.

It is another object of the present invention to provide high voltage energy harvesting in combination with a centralized grid synchronized multiphase regulated current source inverter system, and a visual monitoring and control system for a utility scale renewable energy system.

It is another object of the present invention to provide power collection, conversion, monitoring and control systems for renewable energy, utility sized power systems that can include a three dimensional, visually-oriented, virtual reality display environment for centralized input and output control and monitoring of the power systems by the systems' operators.

BRIEF SUMMARY OF THE INVENTION

In one aspect the present invention is a renewable energy, utility size electric power system. The system has a high voltage, renewable energy harvesting network and a centralized grid synchronized multiphase regulated current source inverter system. The high voltage, renewable energy harvesting network has multiple strings of renewable energy collectors, with each of the strings having a DC output, and multiple renewable energy power optimizers distributed throughout the harvesting network. Each renewable energy power optimizer has at least one energy collector string power optimizer input connected to the DC output of at least one of the multiple strings of renewable energy collectors. Each of the multiple renewable energy power optimizers and transmitters has a high voltage DC output connected to a DC link. The centralized grid synchronized multiphase regulated current source inverter system is connected to the DC link and has a plurality of grid inverter package modules that can be connected to a high voltage electrical grid.

In another aspect the present invention is a renewable energy, utility size electric power system. The system has a high voltage, renewable energy harvesting network; a centralized grid synchronized multiphase regulated current source inverter system; and a virtual immersion monitoring system and central control system for monitoring and controlling the high voltage, renewable energy harvesting network and the centralized grid synchronized multiphase regulated current source inverter system. The high voltage, renewable energy harvesting network has a plurality of strings of renewable energy collectors, with each of the strings having a DC output, and a plurality of renewable energy power optimizers and transmitters. Each of the plurality of renewable energy power optimizers and transmitters has at least one string power optimizer input connected to the DC output of at least one of the plurality of strings of renewable energy collectors. Each of the plurality of renewable energy power optimizers and transmitters has a high voltage DC output connected to a DC link. The grid synchronized multiphase regulated current source inverter system is connected to the DC link and has a plurality of grid inverter package modules.

In another aspect the present invention is a method of harvesting, converting, monitoring and controlling renewable energy from a utility scale renewable energy system. The renewable energy system includes a high voltage, renewable energy harvesting network. The harvesting network includes a plurality of strings of renewable energy collectors, with each of the plurality of renewable energy collectors having a DC output. The harvesting network also includes a plurality of renewable energy power optimizers and transmitters. Each of the plurality of renewable energy power optimizers and transmitters has at least one string power optimizer input connected to the DC output of at least one of the plurality of strings of renewable energy collectors. Each of the plurality of renewable energy power optimizers and transmitters has a high voltage DC output connected to a DC link. The renewable energy system also includes a centralized grid synchronized multiphase regulated current source inverter system that is connected to the DC link and has a plurality of grid inverter package modules. In the present invention, virtual immersion monitoring of the high voltage, renewable energy harvesting network is performed in a three dimensional, visually-oriented, virtual reality display environment, and the high voltage, renewable energy harvesting network and the centralized grid synchronized multiphase regulated current source inverter system is centrally controlled in communication with the three dimensional visually-oriented virtual reality display environment.

The above and other aspects of the invention are further set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 1:
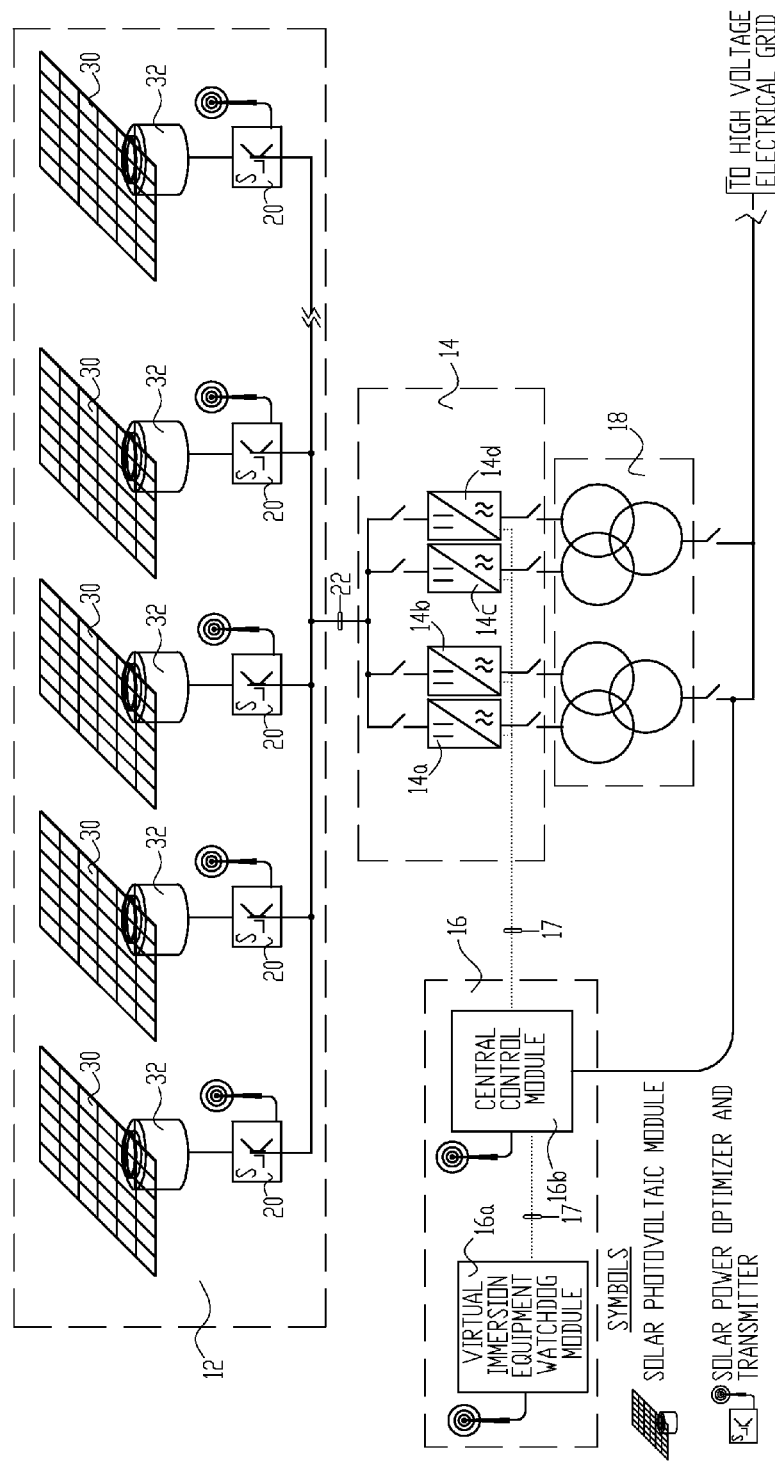
FIG. 1 is a simplified one-line block diagram of one example of a renewable energy, utility size electric power system for the collection and conversion of solar energy, and a monitoring and control system of the present invention for the power system.

FIG. 1 is a simplified one-line block diagram of one example of a renewable energy, utility-size electric power system for the collection and conversion of solar energy, and a monitoring and control system of the present invention for the power system. In this example, there is a high voltage, solar photovoltaic energy collection (also referred to as "harvesting") network 12; a centralized grid synchronized multiphase regulated current source inverter system 14; and an optional virtual immersion monitoring and control system 16. Step-up transformer 18 electrically isolates the outputs of the inverters in the grid inverter package (GrIP) modules 14a-14d from the high voltage electrical grid.

The optional high voltage, solar photovoltaic energy harvesting network and the centralized grid synchronized multiphase regulated current source inverter system are further described in U.S. patent application Ser. No. 12/542,891 (published as Publication No. 2009/0302686), which application is incorporated herein by reference in its entirety.

The virtual immersion monitoring and control system comprises the virtual immersion equipment watchdog (VIEW) module 16a and the central control module 16b.

Figure 2:
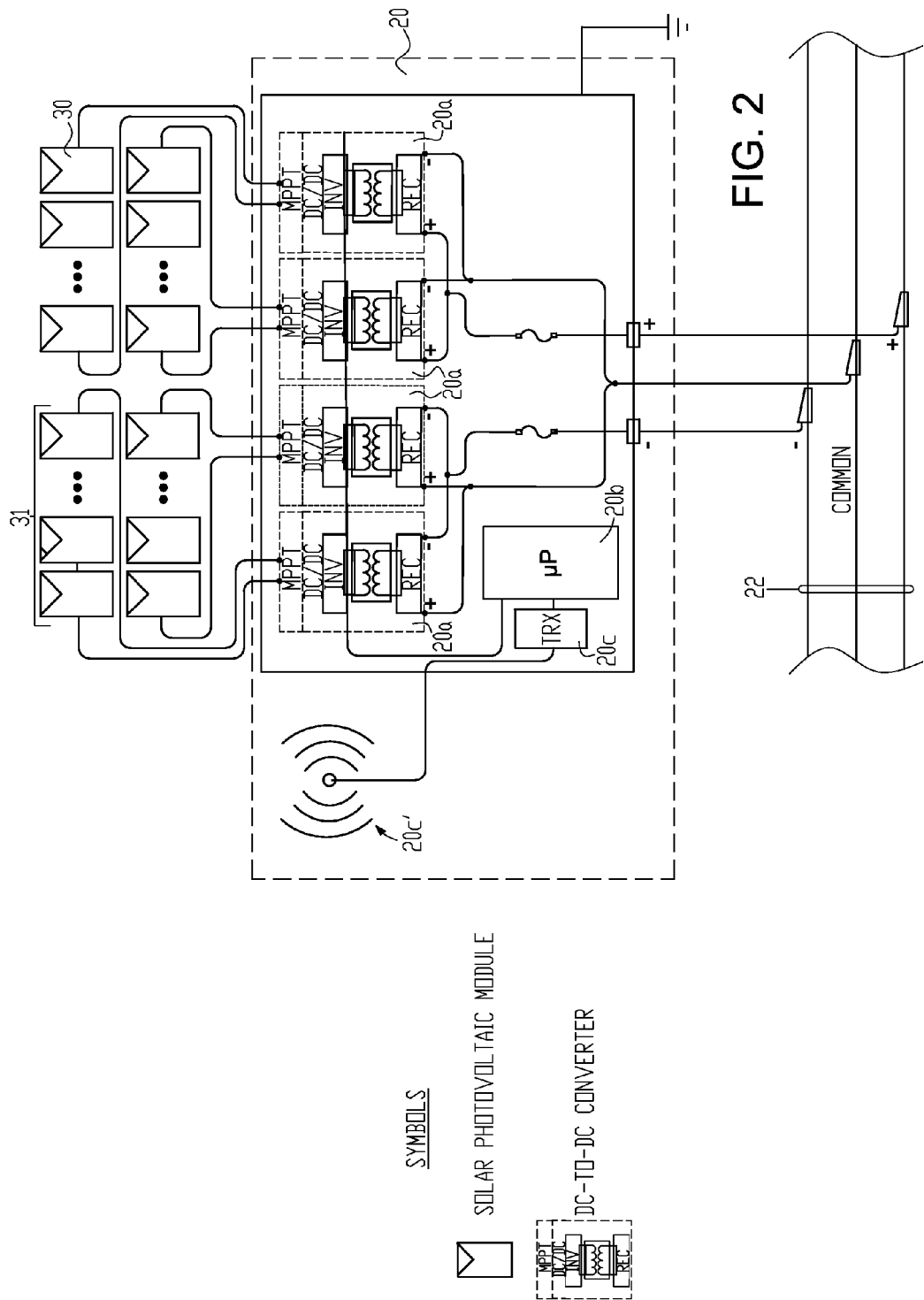
FIG. 2 is a diagram of one example of a solar power optimizer and transmitter utilized in some examples of the present invention.

One example of a solar power optimizer and transmitter (SPOT) utilized in some examples of high voltage, solar photovoltaic energy collection network 12 in FIG. 1 is shown in FIG. 2. SPOT 20 in FIG. 2 comprises a plurality of DC-to-DC converters 20a (four in this example); processor 20b (represented as a microprocessor (µP) in this example); and transceiver 20c (represented as a radio frequency (RF) transceiver in this example with transmitting and receiving antenna 20c').

The four DC-to-DC converters in FIG. 2 convert variable photovoltaic "string" voltages and currents into parallel fixed high voltages (for example 1,250 volts DC). In this example positive (+) outputs of two of the converters are connected together in parallel and negative outputs (−) of the other two converters are connected together in parallel as shown in FIG. 2 to form a common (neutral) circuit. The remaining four outputs of the four converters are connected commonly together as shown in FIG. 2. The converters' paralleled positive and negative outputs are connected (clamped) in series to a DC link (identified as DC link bus 22 in FIG. 1 and FIG. 2) at a high DC voltage (for example, 2.5 kV DC) that is double the output voltage (for example, 1.25 kV DC) of each DC-to-DC converter. Reference is made back to one-line diagram FIG. 1 where a plurality of solar power optimizers and transmitters (as shown in FIG. 2) may be connected to a plurality of solar photovoltaic modules 30.

Figure 3:
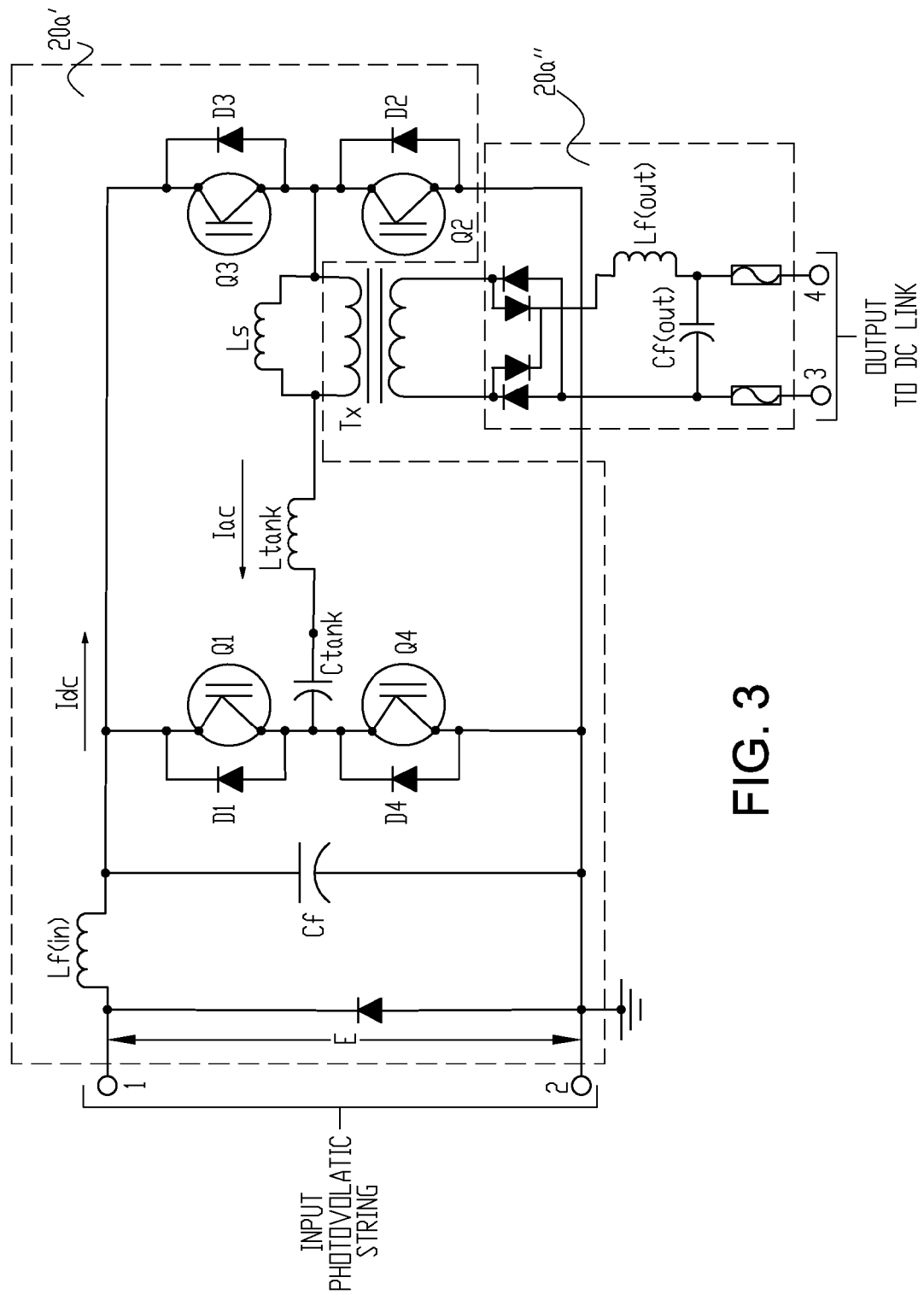
FIG. 3 is a diagram of one example of a resonant DC-to-DC converter that can be utilized in the solar power optimizer and transmitter shown in FIG. 2.
Figure 4:
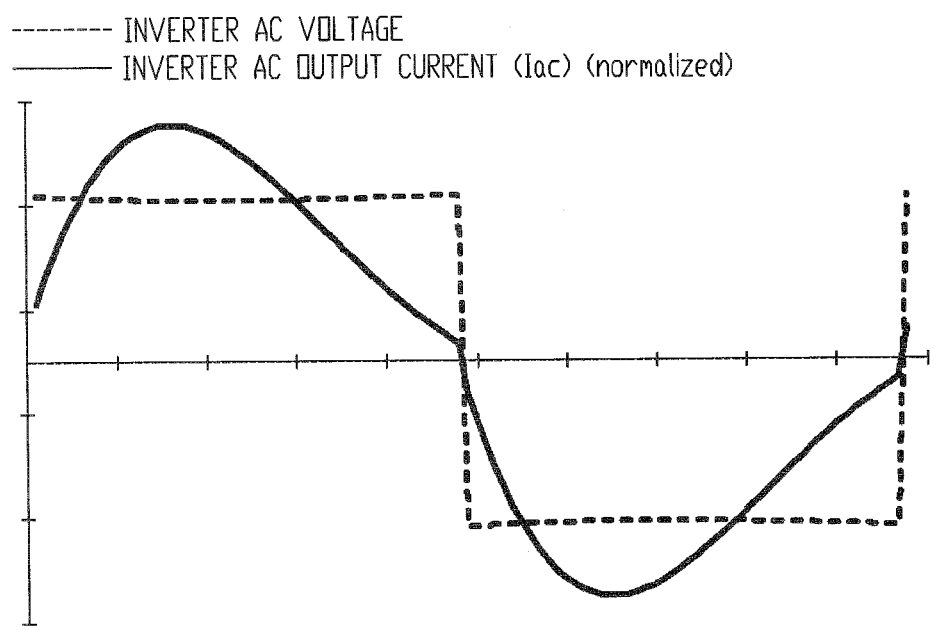
FIG. 4 illustrates the wave shape of the inverter current near resonance of the resonant DC-to-DC converter shown in FIG. 3 when the photovoltaic string voltage connected to the input of the DC-to-DC converter is low.
Figure 5:
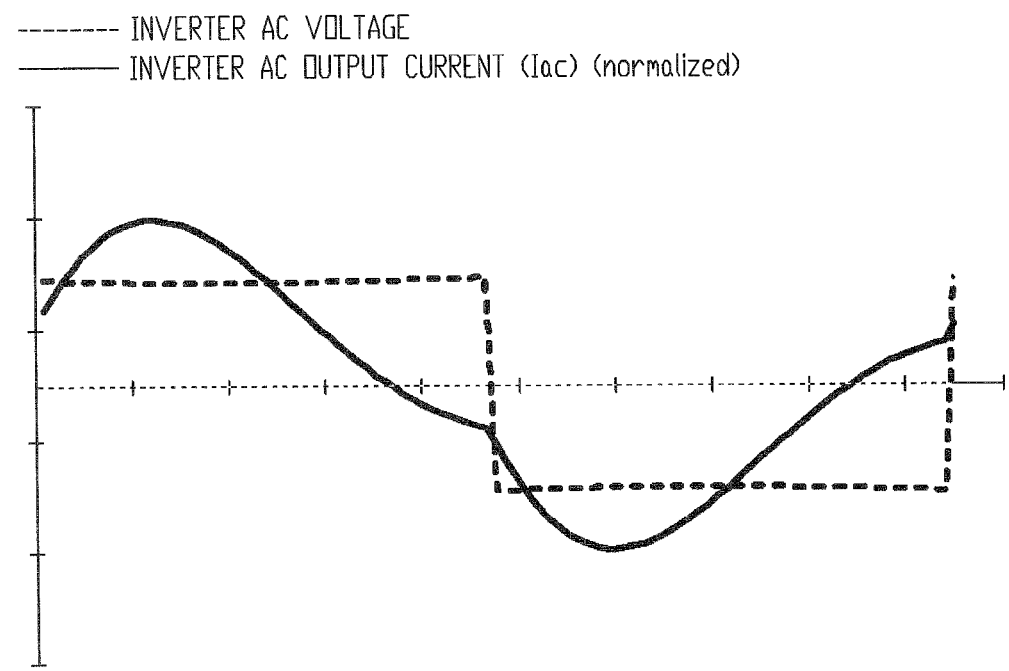
FIG. 5 illustrates the wave shape of the inverter current off-resonance of the resonant DC-to-DC converter shown in FIG. 3 when the photovoltaic string voltage connected to the input of the DC-DC converter is high.

FIG. 3 is one schematic example of a DC-to-DC converter that can be utilized in the solar power optimizer and transmitter 20 shown in FIG. 2. Each DC-to-DC converter consists of two sections: a series resonant full bridge inverter 20a' and a combination output filter and rectifier section 20a". These are isolated from one another via a high frequency (in the range of 10 kHz to 20 kHz) transformer Tx. Power drawn from the input photovoltaic string source at terminals 1 and 2 varies with the operating frequency of the inverter. The input current (Idc) and voltage (E) are measured by processor 20b in FIG. 2 which processor adjusts the operating frequency of the inverter so that the DC-to-DC converter operates at the maximum power point value. The operating frequency of the converter's input inverter is varied near resonance, which is defined by the values of inductor Ltank and capacitor Ctank in FIG. 3 forming a series resonance loop. As the frequency approaches the resonance point, the inverter draws more current from the input photovoltaic string causing the photovoltaic string voltage to drop. As further described below, one of the functions of processor 20b is to maintain the mathematical product of the photovoltaic string voltage and current at the maximum power point value. FIG. 4 illustrates the inverter output current near resonance when the input photovoltaic string voltage can be low and FIG. 5 illustrates the inverter current off-resonance when the photovoltaic string voltage can be high.

Processor 20b may be a microprocessor in communication with I/O devices that sense the string voltage and current at the input to each DC-to-DC converter 20a. The processor monitors the string voltage and current at the input of each converter, and controls operation of each converter to harvest maximum power from each solar photovoltaic module string by executing computer code for a maximum power point tracking (MPPT) algorithm. For example, the algorithm may include "disturb and observe" subroutines by which the operating frequency of the DC-to-DC converter is varied by a small amount and the MPPT algorithm determines whether the harvested power increased or decreased with the frequency perturbation.

Transceiver 20c transmits power system data to the virtual immersion monitoring and control system if used in a particular example of the invention. The power system data can include: string voltage magnitudes; string current magnitudes; string power magnitudes; SPOT output current magnitudes; SPOT operating temperatures; and SPOT operational status data, such as whether the SPOT is operating at full maximum input power from all of the input photovoltaic strings, or limited maximum input power from at least some of the input photovoltaic strings. Transceiver 20c receives power system data that can include power system limit command data and power system ON or OFF status or control. Power system ON or OFF status can be determined, for example, by sensing whether a particular DC-to-DC converter is in an operational oscillation state (power system ON). Remote power system ON or OFF command (from the central control module) can be used to facilitate maintenance of a SPOT. One method of transceiver 20c transmitting and receiving is via a mesh radio system.

In an example of the invention utilizing the solar power optimizer and transmitter shown in FIG. 2, each photovoltaic string 31 can comprise between twenty and twenty-five photovoltaic modules. Output of each string is typically between one and ten amperes DC (at 400 to 1,000 volts DC) depending on the solar energy system parameters such as solar irradiation, shading or environmental deterioration. A cluster of four solar photovoltaic module strings can be connected to a single SPOT as shown in FIG. 2 to produce approximately between 200 to 6,250 "watts per input string" for a maximum of approximately 25,000 watts for each SPOT with a four string input.

Figure 6:
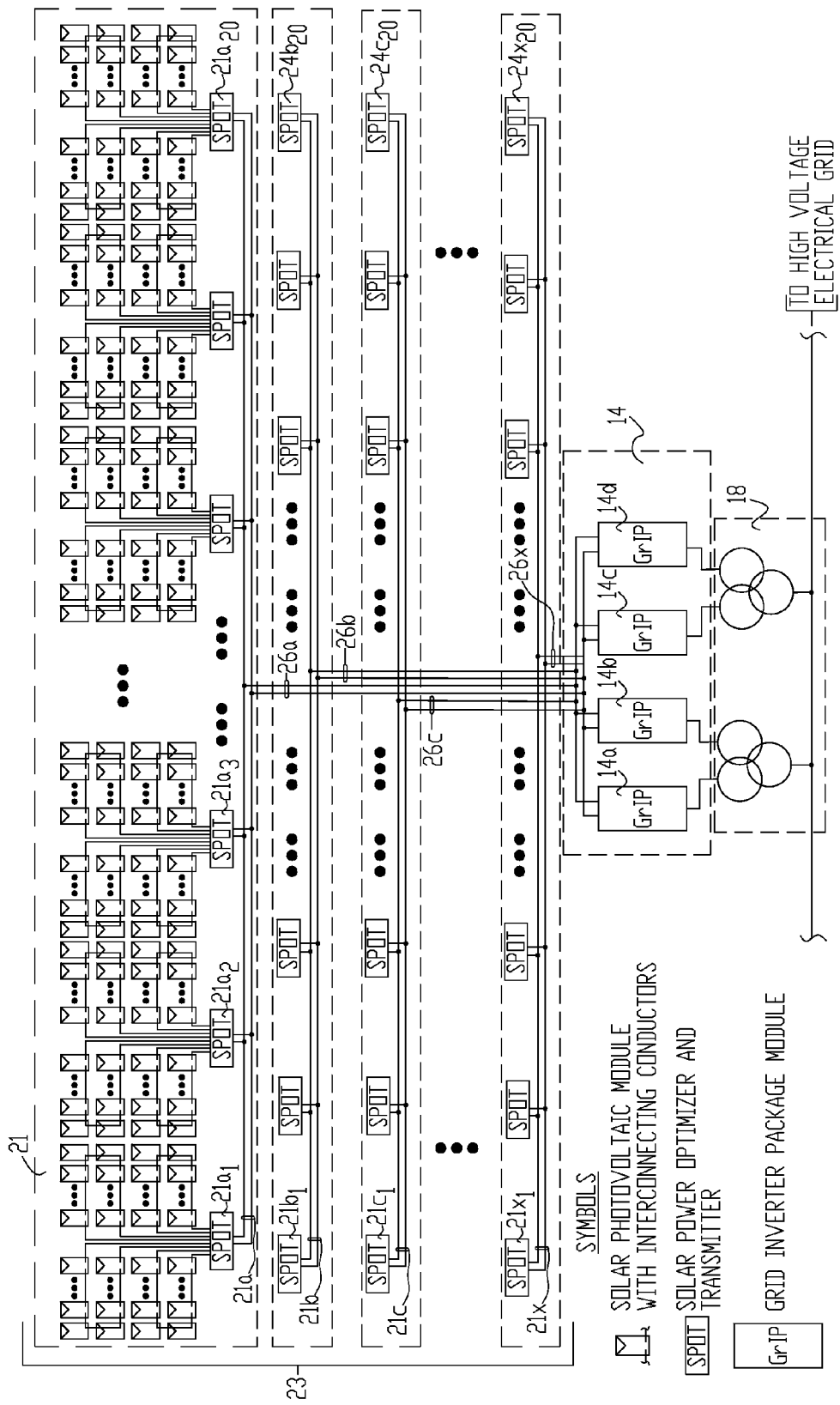
FIG. 6 is one example of the interconnections between a solar farm's solar photovoltaic modules and the solar power optimizers and transmitters utilized in the present invention.

One example of interconnecting a renewable energy utility-size electric power system utilizing solar power optimizers and transmitters of the present invention is illustrated in FIG. 6. A maximum number of solar power optimizers and transmitters, for example twenty, can share each SPOT "horizontal" bus 21a, 21b, 21c . . . 21x, shown in FIG. 6. For example SPOT horizontal bus 21a has twenty solar power optimizers and transmitters 21a$_1$ through 21a$_{20}$ connected to the bus. These interconnected twenty solar power optimizers and transmitters, and the photovoltaic modules connected to these twenty solar power optimizers and transmitters comprise photovoltaic energy harvesting array 21 that represents one section of the high voltage, photovoltaic energy collection network 12 diagrammatically illustrated in FIG. 1 and can produce a maximum of 500 kW from solar radiation. Photovoltaic energy harvesting array 21 may comprise four (photovoltaic) strings of photovoltaic modules connected to each of the twenty solar power optimizers and transmitters in array 21, with each photovoltaic string consisting of around 20 to 25 photovoltaic modules connected in series. The combination of the four photovoltaic strings of photovoltaic modules can be identified as a photovoltaic "cluster" consisting of around 80 to 100 modules, so that with 20 solar power optimizers and transmitters in array 21, a total of 1,600 to 2,000 photovoltaic modules are connected to SPOT horizontal bus 21a. Each of the other photovoltaic energy harvesting arrays that include SPOT horizontal buses 21b . . . 21x (where "x" is a variable representing the last bus and array comprising photovoltaic collection network 23), can also produce a maximum of 500 kW from solar radiation; photovoltaic strings connected to the solar power optimizes and transmitters in these other arrays are not shown in FIG. 6. Each SPOT horizontal bus is respectively connected to a SPOT "vertical" bus (26a, 26b, 26c, . . . 26x in FIG. 6) to the grid inverter package modules (14a, 14b, 14c and 14d) in the centralized grid synchronized multiphase regulated current source inverter system 14. This practical arrangement will limit the size of the conductors forming each of the SPOT vertical buses to a maximum current capacity of 200 amperes DC, based on a maximum of 10 amperes DC supplied by the array of photovoltaic modules connected to each one of the solar power optimizers and transmitters.

Central control module 16b in FIG. 1 comprises circuitry for communicating among the plurality of solar power optimizers and transmitters, the inverter modules in the centralized grid synchronized multiphase regulated current source inverter system, and for transmitting and receiving power system data such as: collecting data transmitted from each SPOT; communicating with grid inverter package modules 14a-14d, preferably by a secure data link 17 (shown in dashed lines in FIG. 1), such as secure Ethernet; communicating with the three dimensional, visually-oriented, virtual reality display environment if used in a particular example of the present invention, for example via a VIEW computer system; monitoring the high voltage (HV) electrical grid voltage injected by the centralized inverter system into the grid; and monitoring the voltage on the DC link 22 between the harvesting 12 and conversion 14 systems; controlling a set DC input current magnitude delivered to each grid inverter package module where the set DC input current magnitude is set to match the supply of electrical current produced by harvesting 12 system with the demand by the conversion 14 system; and control the phase of the AC current injected into the grid relative to the phase of the AC grid voltage.

In one example of the invention, energy conversion system 14 comprises a plurality of grid inverter package modules. While four grid inverter package modules 14a-14d are shown for the system example in FIG. 1 and FIG. 6, typically the total of grid inverter package modules ranges from three to forty in other system examples of invention. A grid inverter package module contains circuitry for: converting the grid inverter package rated power (2,500 kW for the example in FIG. 1) from DC to AC; transmitting (reporting) grid inverter package operating parameters to the central control module and the three dimensional, visually-oriented display environment (for example, the VIEW computer); and receiving operating parameters from the central control module, such as the set DC input current magnitude set point and the grid inverter package's output phase angle as described in the previous paragraph. The transmitted operating parameters can include: DC input current to the grid inverter package module; AC output phase currents from a grid inverter package module; AC output phase voltages from the grid inverter package module; AC output power from the grid inverter package module; output frequency from the grid inverter package module; temperature of coolant (if used) in a grid inverter package module cooling subsystem; and selected grid inverter package circuit component temperatures.

In one example of the present invention, the virtual immersion monitoring system is a three dimensional, visually-oriented, virtual reality display environment comprising a VIEW computer system that: collects harvesting system information; presents the collected harvesting information using three dimensional virtual reality as further described below; and forecasts electric power output for injection into the grid on the basis of available string irradiation for a solar energy renewable power system.

Figure 7:
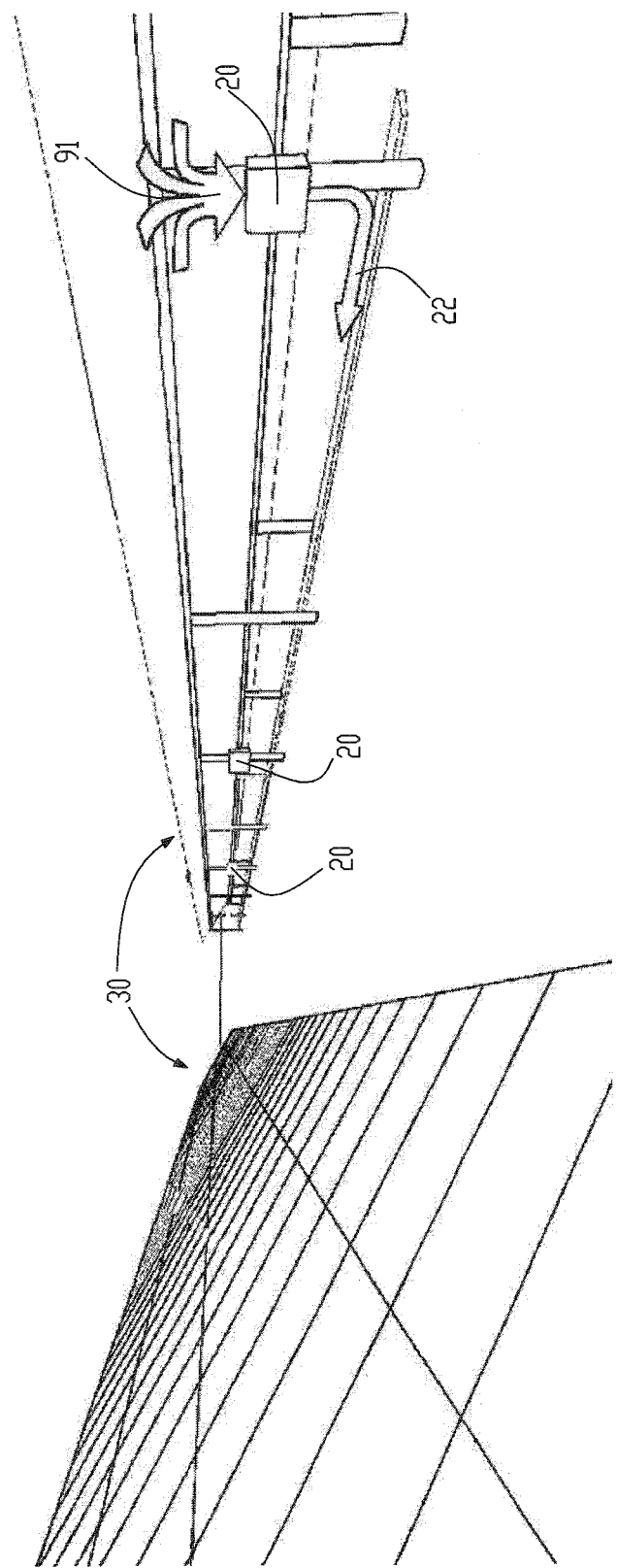
FIG. 7 is a simplified black and white rendition of one three dimensional visual display frame in the three dimensional, visually-oriented, virtual reality display environment of the present invention.

A key element of the virtual immersion monitoring system of the present invention is illustrated in FIG. 7, which is a simplified black and white illustration of a three dimensional image of a partial display of a high voltage, solar photovoltaic energy collection network on a VIEW computer visual display unit. In this illustration photovoltaic modules 30 making up a photovoltaic string are visualized relative to the installed dynamic external environment, including for example, dynamic real time cloud shading of components. Relative location of SPOT 20 is shown, along with conductors 91 from the photovoltaic strings connected to the inputs of SPOT 20 and the DC link 22 to which the outputs of SPOT 20 are connected. Each SPOT can be enclosed in an enclosure approximately 12×12×6 inches with four connections for photovoltaic string input at the top of the enclosure as shown in FIG. 7, and three pass through (except for a SPOT at the end of a SPOT horizontal bus) input and output conductors (positive, negative and neutral (common) as illustrated in FIG. 2) either on the sides of the SPOT enclosure, or the bottom of the SPOT enclosure as illustrated in FIG. 7. Each photovoltaic cluster of photovoltaic modules can be mounted on one structural supporting rack that can also serve as mounting structure (either underneath or on the side of the rack) for the solar power optimizers and transmitters associated with the photovoltaic cluster. All of the color coding elements; cloud visualizations; and other display elements of the visual immersion monitoring system disclosed below are accomplished in the three dimensional image of the power system provided on a VIEW computer visual display unit as an element of the three dimensional, visually-oriented, virtual reality display environment.

For solar power two typical examples of the virtual immersion monitoring and control systems of the present invention are provided. One example uses fixed-tilt tracking photovoltaic arrays and the other uses dual-axis tracking photovoltaic arrays as illustrated by pedestal 32 in FIG. 1. An accurate three-dimensional depiction of the solar farm site is incorporated into the VIEW computer displayed model. The operator's view of the VIEW computer displayed model can be provided on a suitable computer visual output device, such as a video monitor, from a virtual camera view that is moving unconstrained through three dimensional space. The operator has control over movement of the camera through three-dimensional space via a suitable computer input device, such as a handheld controller, joystick or trackball. Movement can be throughout the photovoltaic arrays and can be optionally provided in a predetermined three dimensional space track of the individual components of the solar farm.

The power output of each individual photovoltaic string in the solar farm can be visualized on the VIEW computer visual display unit. Each of photovoltaic strings can be referenced by the SPOT controlling the strings with the SPOT communicating performance data of its associated strings with the central control module. A morning-through-evening daylight transition of the sun over the solar farm can provide varying insolation levels for the photovoltaic modules and will affect the direction in which a dual-axis tracker (if used) will face which is always perpendicular to insolation. In one example of the virtual immersion monitoring system of the present, the magnitudes of power, current and voltage values are represented by a suitable range of color intensities for the images of power system components on the VIEW computer visual display unit, such as photovoltaic modules, solar power optimizers and transmitters, interconnecting electrical conductors, switching components associated with the grid inverter package modules, with the color intensities being a function of the magnitude of power, current and voltage associated with the power system component.

In one example of the invention, color coding of the nominal output of a photovoltaic string of modules is accomplished in shades of a continuous color spectrum that can range from a bright shade of blue for strings operating at full power to darker shades of blue for less than full power, and finally, to black for functional strings generating zero power. The color transition can be linearly related to the nominal power output. Any strings not generating power due to equipment failure can be visually displayed in red to differentiate them from normal strings generating zero power. Power system electrical conductors can be displayed in shades of green to represent the magnitude of current flowing through them with a bright green representing higher current levels and a darker green representing lower current levels. Conductors experiencing a malfunction or fault condition can be shown in red. Enclosures for each SPOT can be displayed in shades of yellow, with higher current levels represented in bright yellow and lower current levels represented in darker yellow. SPOT enclosures with a malfunction or fault condition can be shown in red. Inverter, transformer, grid switchgear and other components can be visually presented in natural colors. An active meter graphic icon can be positioned in a suitable position of the visual display (for example, in the corner of the visual display) with display of real time total electric power generation in suitable units, such as kilowatts. An operator controllable visual display pointing icon can be used by the operator to visually display in the meter graphic icon detailed information of the power output and energy generated by a system component along with a unique identifier, such as a number for the component.

In the virtual immersion monitoring system the image of a cloud can be reconstructed from the shadow it produces on the surface of the photovoltaic panels. The shadow is detected by variable reduction of photovoltaic electric power harvested from a section of the solar farm.

The system can include execution of a prediction algorithm that visually displays the power output of the system at near time in the future (for example, 10 minutes from present in real time) based on cloud movement parameters (cloud direction and velocity) over the site.

In one example model of the invention, visualization can be achieved with dedicated visual layers on the VIEW computer visual display unit so that equipment can be activated (for example, photovoltaic modules made transparent) and the various stages of the power system can be highlighted by turning selected display layers on or off.

Figure 8:
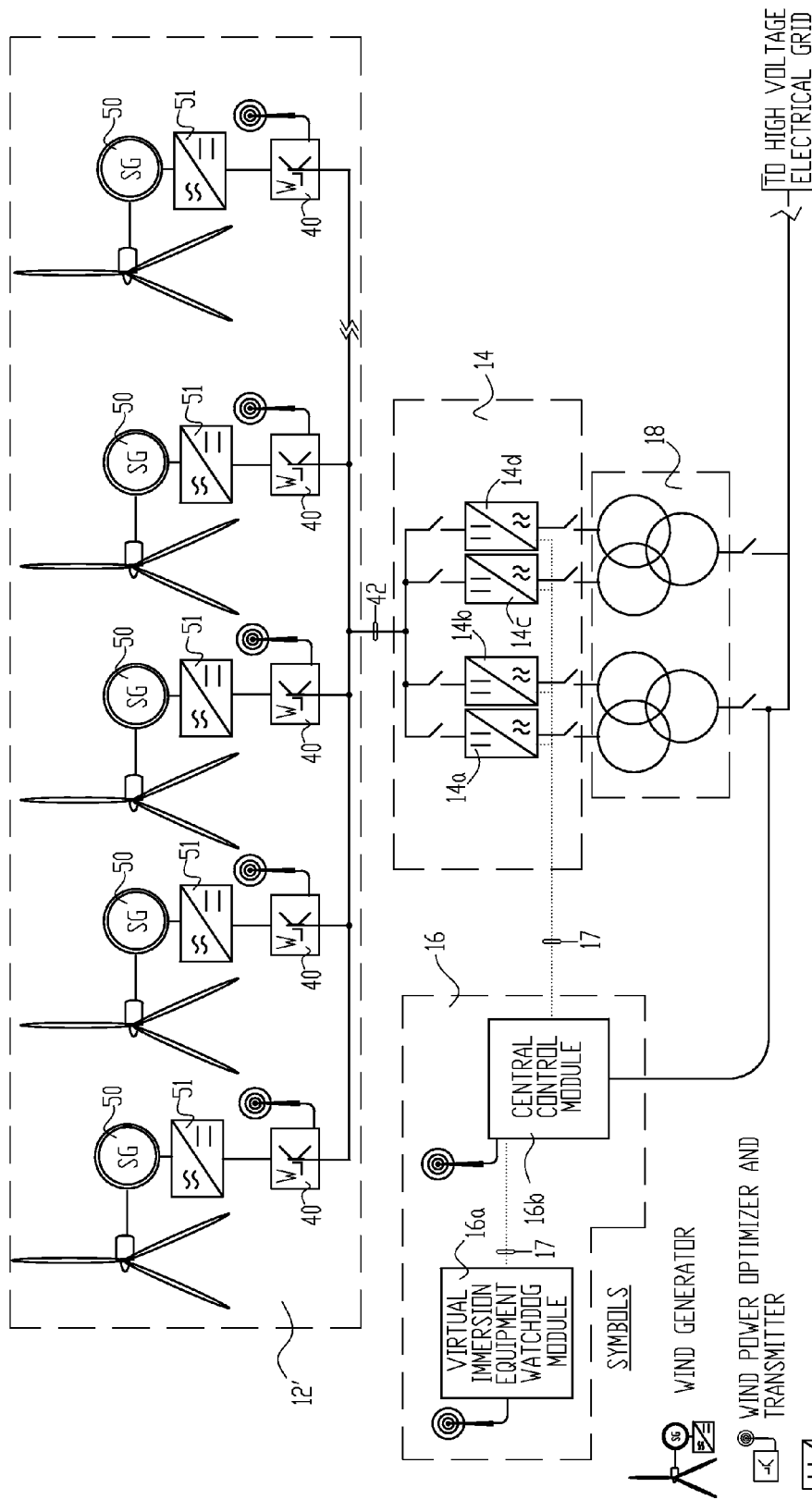
FIG. 8 is a simplified one-line block diagram of one example of a renewable energy, utility-size electric power system for the collection and conversion of wind energy, and a monitoring and control system of the present invention for the power system.

FIG. 8 is a simplified one-line block diagram of one example of a renewable energy, utility-size electric power system for the collection and conversion of wind energy, and a monitoring and control system of the present invention for the power system. The variable frequency AC power produced by a permanent magnet synchronous generator (SG) 50 is rectified by AC-to-DC converter 51 and then applied to the input of a wind power optimizer and transmitter (WPOT) 40. A wind power optimizer and transmitter applies an optimal load to the synchronous generator for operating the wind turbine at the maximum power point value. Wind power optimizer and transmitter 40 is similar to a sun power optimizer and transmitter as described above, except that it typically, but not exclusively, utilizes a single DC-to-DC converter (as shown, for example in FIG. 3) instead of four DC-to-DC converters as shown in FIG. 2 for a solar power optimizer and transmitter. The output of one or more wind power optimizers and transducers are connected via a high voltage DC link 42 to a centralized grid synchronized multiphase regulated current source inverter system 14 where the system utilizes three or more grid inverter package modules, for example, four such modules 14a-14d as shown in FIG. 8.

The virtual immersion monitoring system, if used in a particular example of the invention, communicates with one or more wind power optimizers and transducers and grid inverter package modules to visually depict operation of the wind farm on a VIEW computer display unit. The three dimensional, visually-oriented display environment includes a three dimensional terrain layer of the wind farm. A generic wind turbine graphic can be used. Depending on the number of turbines, an appropriate number of grid inverter packages will be selected, with each turbine having an output of approximately 1.5 MW, and each grid inverter package having a power rating of 2.5 megawatt (MW). The visualization of the virtual immersion monitoring system can be aligned so that the grid inverter packages are in the foreground, and the turbines and connections to the inverter system are clearly visible. Transformers can be located next to the inverters outside of a building in which the inverters are located. The visualization of a wind turbine's output can be a power meter graphic icon with at least real time power output and optionally historical data in numeric or graphic form layered on the three dimensional, visually-oriented display environment.

Elements of the virtual immersion system described above for solar energy systems also apply to a virtual immersion system for wind energy system unless the element is specifically addressed to a component or function uniquely associated with solar energy and not wind energy.

The present invention has been described in terms of preferred examples and embodiments. Equivalents, alternatives and modifications, aside from those expressly stated, are possible and within the scope of the invention.

The invention claimed is:

1. A renewable energy, utility size electric power system comprising:
   a high voltage, renewable energy harvesting network comprising:
      a plurality of strings of renewable energy collectors, each of the plurality of strings of renewable energy collectors having a DC output;
      a plurality of renewable energy power optimizers and transmitters, each of the plurality of renewable energy power optimizers and transmitters having at least one string power optimizer input connected to the string DC output of at least one of the plurality of strings of renewable energy collectors, each of the plurality of renewable energy power optimizers and transmitters having a high voltage DC output connected to a DC link, each of the plurality of renewable energy optimizers and transmitters having at least one DC-to-DC converter with a variable frequency controlled resonant inverter, the variable frequency controlled resonant inverter having a resonant inverter input connected to the string DC output and a resonant inverter output connected to an input of a rectifier by an isolation transformer, the rectifier having an output connected to a positive rectifier output and a negative rectifier output, the positive and negative rectifier outputs connected to the DC link; and
      a centralized grid synchronized multiphase regulated current source inverter system having a plurality of grid inverter package modules, each of the plurality of grid inverter package modules having an input connected to the DC link.

2. The renewable energy, utility size electric power system of claim 1 wherein each one of the plurality of strings of renewable energy collectors comprises a plurality of solar photovoltaic modules and the at least one DC-to-DC converter comprises:
   at least one pair of DC-to-DC converters, the at least one pair of DC-to-DC converters having a string inverter input connected to each of the at least one string power optimizer input and a DC link output connected to the DC link; and
   a processor for sensing and monitoring the voltage and current at the string inverter input of each of the at least one pair of DC-to-DC converters and for controlling each of the at least one pair of DC-to-DC converters to a maximum power point.

3. The renewable energy, utility size electric power system of claim 1 wherein each one of the plurality of strings of renewable energy collectors comprises a plurality of solar photovoltaic modules and the at least one DC-to-DC converter comprises:
   four DC-to-DC converters, the four DC-to-DC converters comprising a separate first and second pairs of DC-to-DC converters, each of the four DC-to-DC converters having a string inverter input connected to each of the at least one string power optimizer input, and a positive and negative rectifier output, the first separate pair of DC-to-DC converters having the positive rectifier outputs connected in parallel to the DC link, and the second separate pair of DC-to-DC converters having the negative rectifier outputs connected in parallel to the DC link, the negative rectifier outputs of the first separate pair of DC-to-DC converters and the positive rectifier outputs of the second separate pair of DC-to-DC converters connected together commonly to the DC link;
   a processor for sensing and monitoring the voltage and current at the string inverter input of each of the four DC-to-DC converters and for controlling each of the four DC-to-DC converters to a maximum power point; and
   a transceiver, the transceiver connected to an antenna for transmitting and receiving of a plurality of high voltage, renewable energy harvesting network data and a plurality of centralized grid synchronized multiphase regulated current source inverter system data.

4. The renewable energy, utility size electric power system of claim 1 further comprising a central control system, the central control system comprising:
   a means for communicating among the plurality of renewable energy power optimizers and transmitters and the plurality of grid inverter package modules; and
   a means for transmitting and receiving a plurality of high voltage, renewable energy harvesting network data and a plurality of centralized grid synchronized multiphase regulated current source inverter system data.

5. The renewable energy, utility size electric power system of claim 3 wherein the processor controls each of the four DC-to-DC converters to the maximum power point by varying an operating frequency of the variable frequency controlled resonant inverter.

6. The renewable energy, utility size electric power system of claim 1 wherein the plurality of renewable energy collectors comprises a plurality of wind turbine driven AC generators having a rectified dc output and each of the plurality of the renewable energy power optimizers and transmitters further comprises
   a processor for sensing and monitoring the voltage and current at the string inverter input of each of the at least one DC-to-DC converters and for controlling each of the at least one DC-to-DC converters to a maximum power point.

7. A method of harvesting, converting, monitoring and controlling renewable energy from a utility scale renewable energy system comprising: a high voltage, renewable energy harvesting network comprising: a plurality of strings of renewable energy collectors, each of the plurality of strings of renewable energy collectors having a DC output; and a centralized grid synchronized multiphase regulated current source inverter system having a plurality of grid inverter package modules, the method comprising the steps of:

optimizing the collector DC outputs of the plurality of strings of renewable energy collectors to a maximum power point with a plurality of renewable energy power optimizers and transmitters distributed within the high voltage, renewable energy harvesting network, each of the plurality of renewable energy optimizers and transmitters having at least one DC-to-DC converter with a variable frequency controlled resonant inverter, the variable frequency controlled resonant inverter having a resonant inverter input connected to at least one of the collector DC outputs and a resonant inverter output connected to an input of a rectifier by an isolation transformer, the rectifier having an output connected to a positive rectifier output and a negative rectifier output, the positive and negative rectifier outputs connected to the DC link with an optimizer DC output; and connecting the optimizer DC outputs of the plurality of renewable energy power optimizers and transmitters to the centralized grid synchronized multiphase regulated current source inverter system by a DC link.

8. A renewable energy, utility size electric power system comprising:

a high voltage, renewable energy harvesting network comprising:
 a plurality of strings of renewable energy collectors, each of the plurality of strings of renewable energy collectors having a string DC output;
 a plurality of renewable energy power optimizers and transmitters, each of the plurality of renewable energy power optimizers and transmitters having at least one string power optimizer input connected to the DC output of at least one of the plurality of strings of renewable energy collectors, each of plurality of renewable energy optimizers and transmitters having at least one DC-to-DC converter with a variable frequency controlled resonant inverter, the variable frequency controlled resonant inverter having a resonant inverter input connected to the string DC output and a resonant inverter output connected to an input of a rectifier by an isolation transformer, the rectifier having an output connected to a positive rectifier output and a negative rectifier output for a high voltage DC output connected to a DC link;

a centralized grid synchronized multiphase regulated current source inverter system having a plurality of grid inverter package modules; and a virtual immersion monitoring system and a central control system for monitoring and controlling the high voltage, renewable energy harvesting network and the centralized grid synchronized multiphase regulated current source inverter system.

9. The renewable energy, utility size electric power system of claim 8 wherein each one of the plurality of strings of renewable energy collectors comprises a plurality of solar photovoltaic modules and the at least one DC-to-DC converter comprises:

at least one pair of DC-to-DC converters, the at least one pair of DC-to-DC converters having a string inverter input connected to the power optimizer input and a DC link output connected to the DC link; and a processor for sensing and monitoring the voltage and current at the string inverter input of each of the at least one pair of DC-to-DC converters and for controlling each of the at least one pair of DC-to-DC converters to the maximum power point.

10. The renewable energy, utility size electric power system of claim 8 wherein each one of the plurality of strings of renewable energy collectors comprises a plurality of solar photovoltaic modules and the at least one DC-to-DC converter comprises:

four DC-to-DC converters, the four DC-to-DC converters comprising a separate first and second pairs of DC-to-DC converters, each of the four DC-to-DC converters having a string inverter input connected to the power optimizer input, and a positive and negative rectifier output, the first separate pair of DC-to-DC converters having the positive rectifier outputs connected in parallel to the DC link, and the second separate pair of DC-to-DC converters having the negative rectifier outputs connected in parallel to the DC link, the negative rectifier outputs of the first separate pair of DC-to-DC converters and the positive rectifier outputs of the second separate pair of DC-to-DC converters connected together commonly to the DC link;

a processor for sensing and monitoring the voltage and current at the string inverter input of each of the four DC-to-DC converters and for controlling each of the four DC-to-DC converters to the maximum power point; and a transceiver, the transceiver connected to an antenna for transmitting and receiving of a plurality of high voltage, renewable energy harvesting network data and a plurality of centralized grid synchronized multiphase regulated current source inverter system data to and from the virtual immersion monitoring system and the central control system.

11. The renewable energy, utility size electric power system of claim 8 wherein the central control system comprises a means for communicating among the plurality of renewable energy power optimizers and transmitters and the plurality of grid inverter package modules; a means for transmitting and receiving a plurality of high voltage, renewable energy harvesting network data and a plurality of centralized grid synchronized multiphase regulated current source inverter system data; and a means for communicating with the virtual immersion monitoring system.

12. The renewable energy, utility size electric power system of claim 8 wherein the virtual immersion monitoring system comprises a virtual immersion equipment watchdog computer system for collecting a plurality of high voltage, renewable energy harvesting network data and a plurality of centralized grid synchronized multiphase regulated current source inverter system data; for visual display of the plurality of high voltage, renewable energy harvesting network data and the plurality of centralized grid synchronized multiphase regulated current source inverter system data in a three dimensional, visually-oriented virtual reality display environment; and for forecasting an electric power output from the high voltage, renewable energy harvesting network for injection into a high voltage electrical grid based on available irradiation of the plurality of strings of renewable energy collectors.

13. The renewable energy, utility size electric power system of claim 10 wherein the processor controls each of the four DC-to-DC converters to the maximum power point by varying the operating frequency of the variable frequency controlled resonant inverter.

14. The renewable energy, utility size electric power system of claim 8 wherein each one of the plurality of renewable energy collectors comprises a plurality of wind turbine driven ac generators having a rectified dc output and each of the plurality of the renewable energy power optimizers and transmitters further comprises
a processor for sensing and monitoring the voltage and current at the string inverter input of each of the at least one DC-to-DC converters and for controlling each of the at least one DC-to-DC converters to a maximum power point.

15. The renewable energy, utility size electric power system of claim 14 wherein the virtual immersion monitoring system comprises a virtual immersion equipment watchdog computer system for collecting a plurality of high voltage, renewable energy harvesting network data and a plurality of centralized grid synchronized multiphase regulated current source inverter system data; and for visual display of the plurality of high voltage, renewable energy harvesting network data and the plurality of centralized grid synchronized multiphase regulated current source inverter system data in a three dimensional, visually-oriented virtual reality display environment.

16. The renewable energy, utility size electric power system of claim 12 wherein the processor controls each of the at least one DC-to-DC converters to the maximum power point by varying an operating frequency of the variable frequency controlled resonant inverter.

17. A method of harvesting, converting, monitoring and controlling renewable energy from a utility scale renewable energy system comprising: a high voltage, renewable energy harvesting network comprising: a plurality of strings of renewable energy collectors, each of the plurality of renewable energy collectors having a string DC output; and a plurality of renewable energy power optimizers and transmitters, each of the plurality of renewable energy power optimizers and transmitters having at least one string power optimizer input connected to the string DC output of at least one of the plurality of strings of renewable energy collectors, each of the plurality of renewable energy optimizers and transmitters having at least one DC-to-DC converter with a variable frequency controlled resonant inverter, the variable frequency controlled resonant inverter having a resonant inverter input connected to the string DC output and a resonant inverter output connected to an input of a rectifier by an isolation transformer, the rectifier having an output connected to a positive rectifier output and a negative rectifier output, the positive and negative rectifier outputs having a high voltage DC output connected to a DC link; and a centralized grid synchronized multiphase regulated current source inverter system having a plurality of grid inverter package modules; the method comprising the steps of virtual immersion monitoring of the high voltage, renewable energy harvesting network in a three dimensional, visually-oriented virtual reality display environment and centrally controlling the high voltage, renewable energy harvesting network and the centralized grid synchronized multiphase regulated current source inverter system in communication with the three dimensional, visually-oriented virtual reality display environment.

* * * * *